(12) United States Patent
Moriya et al.

(10) Patent No.: US 8,089,165 B2
(45) Date of Patent: Jan. 3, 2012

(54) DEVICE COMPRISING ELECTRODE PAD

(75) Inventors: Taro Moriya, Kanagawa (JP); Yasutaka Nakashiba, Kanagawa (JP); Satoshi Uchiya, Kanagawa (JP); Masayuki Furumiya, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 278 days.

(21) Appl. No.: 12/430,557

(22) Filed: Apr. 27, 2009

(65) Prior Publication Data

US 2009/0218652 A1  Sep. 3, 2009

Related U.S. Application Data

(62) Division of application No. 11/118,475, filed on May 2, 2005, now Pat. No. 7,547,976.

(30) Foreign Application Priority Data

Apr. 30, 2004 (JP) .................................. 2004-135547

(51) Int. Cl.
H01L 23/48 (2006.01)

(52) U.S. Cl. .................. 257/781; 257/786; 257/E23.02; 438/614

(58) Field of Classification Search .................. 257/786, 257/781
See application file for complete search history.

(56) References Cited

U.S. PATENT DOCUMENTS

| 5,661,081 | A | 8/1997 | Hsue et al. |
| 6,097,098 | A | 8/2000 | Ball |
| 6,339,257 | B1 | 1/2002 | Fujiki et al. |
| 6,462,401 | B2 | 10/2002 | Fujii |
| 6,476,491 | B2 | 11/2002 | Harada et al. |
| 6,756,671 | B2 | 6/2004 | Lee et al. |
| 6,765,277 | B2 | 7/2004 | Chen et al. |
| 6,927,347 | B2 | 8/2005 | Yamaguchi et al. |
| 2003/0153196 | A1 | 8/2003 | Tzeng et al. |
| 2003/0192716 | A1 | 10/2003 | Yamaguchi et al. |
| 2005/0009300 | A1 | 1/2005 | Murari et al. |

FOREIGN PATENT DOCUMENTS

| JP | 1-201951 | 8/1989 |
| JP | 11-017158 | 1/1990 |
| JP | 9-082747 | 3/1997 |
| JP | 11-017158 | 1/1999 |
| JP | 2000-332045 | 11/2000 |
| JP | 2001-274129 | 10/2001 |
| JP | 2002-198534 | 7/2002 |
| JP | 2003-092353 | 3/2003 |
| JP | 2003-115466 | 4/2003 |
| JP | 2003-234348 | 8/2003 |

OTHER PUBLICATIONS

Japanese Patent Office issued a Japanese Office Action dated December 1m 2009, Application No. 2004-135547.
Japanese Patent Office issued a Japanese Office Action dated May 11, 2010, Application No. 2004-135547.

*Primary Examiner* — Ajay K Arora
(74) *Attorney, Agent, or Firm* — Young & Thompson

(57) ABSTRACT

A pad structure 100 includes an electrode pad (a first electrically conducting film 104 and a second electrically conducting film 110) and an insulating film provided over a peripheral region of the electrode pad so as to surround the electrode pad, and the insulating film has a structure including a protective film (a cover oxide film 106) and a transparent resin film (a transparent resin 108) provided on the cover oxide film 106.

11 Claims, 7 Drawing Sheets

DEVICE COMPRISING ELECTRODE PAD

The present application is based on Japanese Patent Application NO. 2004-135547, the content of which is incorporated hereinto by reference.

BACKGROUND OF THE INVENTION

1. Field of the Invention

The present invention relates to a device comprising an electrode pad.

2. Related Art

Devices comprising conventional electrode pads include, for example, a type of a device described in Japanese Patent Laid-Open No. 1999-17,158 (H11-17,158). The device described in Japanese Patent Laid-Open No. 1999-17,158 is provided on a wafer, and includes a protective sheet, which has been applied to a surface of the wafer before conducting a dicing process, so that an adhesion of contaminations such as cutting wastes or the like generated during the dicing process for the electrode is prevented.

SUMMARY OF THE INVENTION

However, it has now been discovered that the related art including the technique of Japanese Patent Laid-Open No. 1999-17,158 has a room for improving in a point that the cutting wastes or the like generated during the dicing process tend to be remained on the electrode pad.

According to the present invention, there is provided a device, comprising: an electrode pad; and an insulating film provided over a peripheral region of the electrode pad and disposed so as to surround the electrode pad; wherein the insulating film has an opening in a region on a side of a peripheral portion of the device.

According to the present invention, the residual dicing wastes or the like on the electrode pad can be reduced in the process for manufacturing the device using the wafer process, since the device has the configuration, in which the insulating film has the opening in the region on the side of the peripheral section of the electrode pad. In addition, since the side surface of the electrode pad is coated with the insulating protective film, the insulation property of the device can be improved. Accordingly, the device having higher reliability can be achieved while improving the insulation property of the device.

According to the present invention, there is provided a solid-state image sensing device, comprising: an electrode pad; and an insulating film being provided so as to surrounded the electrode pad over a peripheral region of the electrode pad, wherein the insulating film includes a protective film and a transparent resin film provided on the protective film, and wherein the transparent resin film has an opening in a region on a side of a peripheral portion of the solid-state image sensing device.

According to the present invention, the residual dicing wastes or the like on the electrode pad can be reduced in the process for manufacturing the solid-state image sensing device using the wafer process, since the solid-state image sensing device has the configuration, in which the insulating film has the opening in the region on the side of the device peripheral section of the electrode pad. In addition, since the side surface of the electrode pad is coated with tire insulating protective film, the insulation property of the solid-state image sensing device can be improved. Accordingly, the solid-state image sensing device having higher reliability can be achieved while improving the insulation property of the solid-state image sensing device.

According to the present invention, the residual cutting wastes or the like generated during the dicing process on the electrode pad is reduced, thereby presenting devices having improved reliability.

BRIEF DESCRIPTION OF THE DRAWING

The above and other objects, advantages and features of the present invention will be more apparent from the following description taken in conjunction with the accompanying drawings, in which.

DETAILED DESCRIPTION OF THE INVENTION

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Embodiments according to the present invention will be described as follows in further detail, in reference to the annexed figures. In all figures, identical numeral is assigned to an element commonly appeared in the figures, and the detailed description thereof will not be presented.

Figure 1:
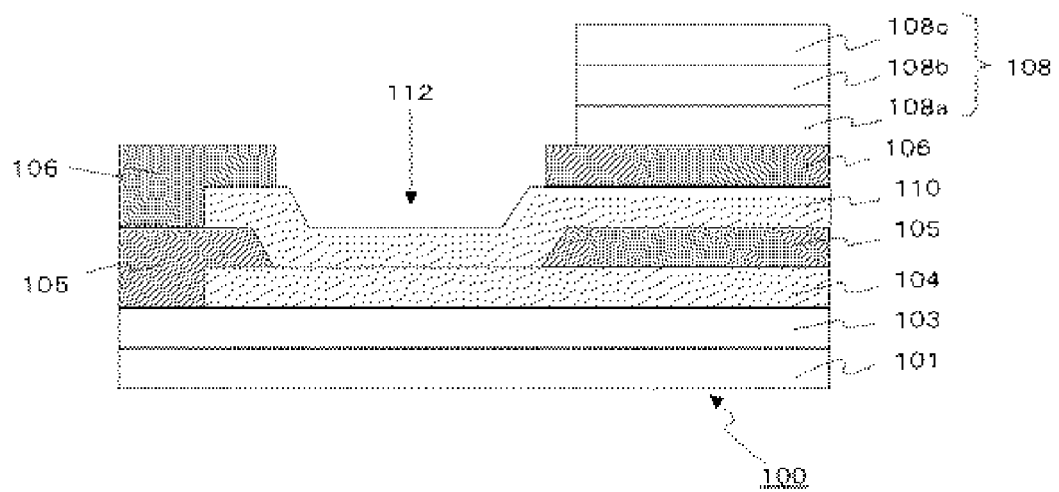
FIG. 1 is a schematic cross-sectional view of a pad structure according to an embodiment of the present invention.

A pad structure 100 shown in FIG. 1 has a structure including an electrode pad (a first electrically conducting film 104 and a second electrically conducting film 110) and an insulating film, which is provided a peripheral region of the electrode pad and disposed so as to surround the electrode pad, and the insulating film includes a protective film (a cover oxide film 106) and a transparent resin film (a transparent resin 108) provided on the cover oxide film 106.

Figure 6:
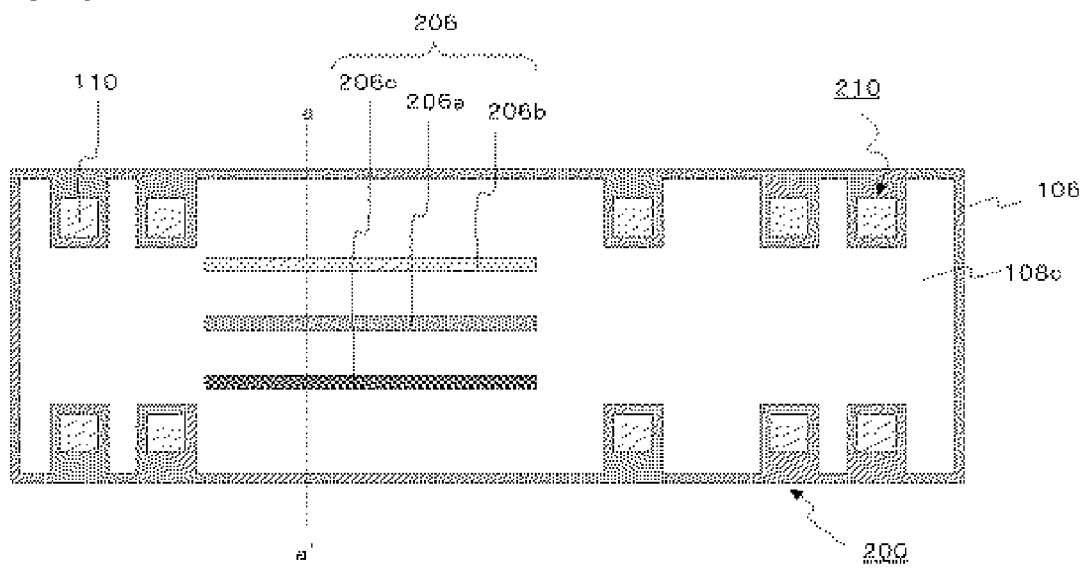
FIG. 6 is a plan view of a solid-state image sensing device according to an embodiment of the present invention.

In addition, in a solid-state image sensing device 200 shown in FIG. 6, a transparent resin film (transparent resin 108) of the pad structure 100 is partially opened in a region on the side of the peripheral portion of the solid-state image sensing device.

First Embodiment

The present embodiment will describe a pad structure constituting a part of a solid-state image sensing device, in reference to annexed figures. Here, the solid-state image sensing device in the present embodiment is characterized in its configuration of the pad structure, and the rest of the device is provided by the typical structure of the solid-state image sensing device.

FIG. 1 is an enlarged cross-sectional view for describing the structure of the pad structure 100 of the solid-state image sensing device.

The pad structure 100 is composed of a silicon substrate 101, a first interlayer film 103, a first electrically conducting from 104, a second interlayer film 105, a cover oxide film 106, a transparent resin 108 and a second electrically conducting film 110. Since the pad structure 100 is manufactured by a wafer process, a plurality of pad structure 100 are provided on the wafer, and are manufactured by dicing the wafer along a scribe line.

The electrode pad is composed of the first electrically conducting film 104 (first electric conductor) and the second electrically conducting film 110 (the second, electric conductor) that is provided to contact with the upper surface of the first electrically conducting film 104.

As shown in FIG. 1, the second electrically conducting film 110 has a concave portion 112. In addition, the second electrically conducting film 110 is electrically coupled to the first electrically conducting film 104 in the region provided with the concave portion 112. Concerning the rest of the region provided with the concave portion 112, an existence of the second interlayer film 105 provided between the first electrically conducting film 104 and the second electrically conducting film 110 prevents the contacts between the first electrically conducting film 104 and the second electrically conducting film 110, and thus the first electrically conducting film 104 is electrically isolated from the second electrically conducting film 110. Here, in the present embodiment, a length of one side of the concave portion 112 is, fox example, on the order of 60 μm to 80 μm.

Figure 2:
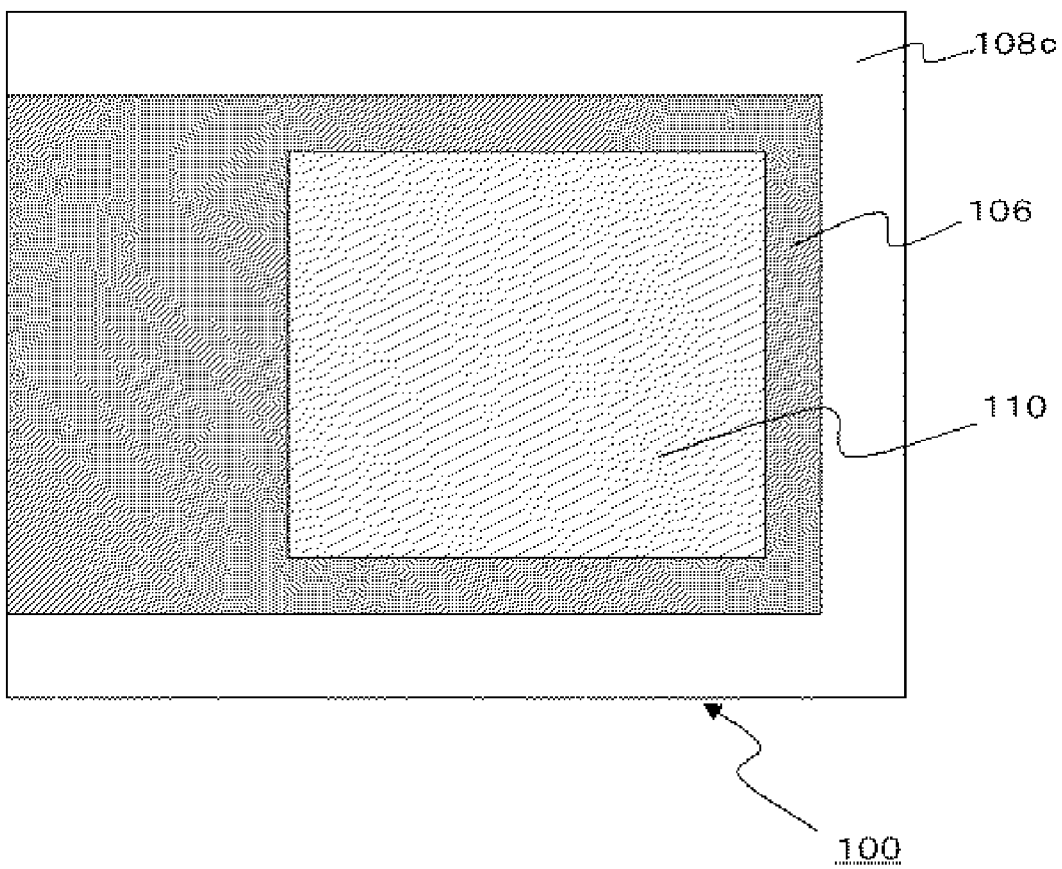
FIG. 2 is a schematic plan view of the pad structure according to the embodiment of the present invention.

A geometry of the vicinity of the concave portion 112 viewed from the upper direction is a rectangle shape such as square and the like, as illustrated in FIG. 2, which is a top plan view of the pad structure 100. In FIG. 2, left side of the pan structure 100 is a side of a scribe line for utilizing on the dicing process. While aluminum (Al) is employed for the material composing of the first electrically conducting film 104 and the second electrically conducting film 110 in the present embodiment, other materials having conductivity may also be employed.

Materials available for composing the first interlayer film 103 and the second interlayer film 105 include, for example, $SiO_2$, SiON, SiOC, SiN or the like. Here, the film thicknesses of the first electrically conducting film 104 and the second electrically conducting film 110 are, for example, on the order of 1 μm. The film thicknesses of the first interlayer film 103 and the second interlayer film 105 are also, for example, on the order of 1 μm. respectively.

Here, an exposure of the concave portion 112 of the second electrically conducting film 110 is achieved by removing the cover oxide film 106 and the transparent resin 108, as will be described later in a description of a process for manufacturing the pad structure 100.

The cover oxide film 106 functioning as an insulating protective film is composed of, for example, an insulating film such, as $SiO_2$, SiON, SiOC and the like. The second electrically conducting film 110 can be insulated by being coated with the cover oxide film 106. Here, $SiO_2$ is employed as the material composing the cover oxide film 106 in the present embodiment, and the film thickness of the cover oxide film 106 is, for example, on the order of 1 μm.

The transparent resin 108 is provided on a portion of the cover oxide film 106 except the side of the scribe line for utilizing in the dicing process of the pad structure 100, as shown in FIG. 2. More specifically, no transparent resin 108 is provided on the side of the scribe line for utilizing in the dicing process of the pad structure 100. Therefore, the concave portion 112 includes an opening or a vent opening, which is an empty of one sidewall of the rectangular concave portion, on the side of the scribe line for utilizing in the dicing process.

The transparent resin 108 has a layered, structure comprising a planarizing film 108a, a middle layer 108b and a topcoat 108c.

Here, available materials composing the planarizing film 108a, the middle layer 108b and the topcoat 108c may include, for example, acrylic resin or the like, and the film thicknesses of the respective layers may be, for example, on the order of 1 μm. Here, the presence of the vent opening on the transparent resin 108 on the side of the scribe line of the pad structure 100 in the cover oxide film 106 inhibits remaining of silicon wastes or the like generated during the process for dicing the pad structure 100 on the wafer within the concave portion 112.

Next, the process for manufacturing the pad structure 100 will be described.

FIGS. 3A to 3D, FIGS. 4A and 4B, and FIGS. 5A, and 5B are enlarged cross-sectional views, illustrating the process for manufacturing the pad structure 100 that constitutes the solid-state image sensing device according to the present embodiment.

Figure 3A:
FIGS. 3A, 3B, 3C and 3D are schematic cross-sectionals views of the pad structure, for describing the process for manufacturing the pad structure according to the embodiment of the present invention.

Firstly, a first interlayer film 103 is deposited on a silicon substrate 101 by a chemical vapor deposition (CVD) or fine like. Available materials for composing the first interlayer film 103 include, for example, $SiO_2$, SiON, SiOC, SiN or the like. Further, the thickness of the first interlayer film 103 to be deposited is, for example, on the order of 1 μm. Next, a first electrically conducting film 104 is deposited by a sputtering technique or the like. Aluminum (Al) is employed as the material composing the first electrically conducting film 104 in the present embodiment. Further, the thickness of the first electrically conducting film 104 to be deposited is, for example, on the order of 1 μm. Then, a resist film is formed on the first electrically conducting film 104 by a spin coating technique or the like. A resist pattern is formed on the resist film by employing a photolithography technique, and thereafter a dry etch process is carried out by using the patterned resist as a mask to selectively remove the first electrically conducting film 104. Then, a second interlayer film 105 is deposited by a CVD or the like. Available materials for composing the second interlayer film 105 include, for example, $SiO_2$, SiON, SiOC, SiN or the like. Further, the thickness of one second interlayer film 105 to be deposited is, for example, on the order of 1 μm (FIG. 3A).

Figure 3B:
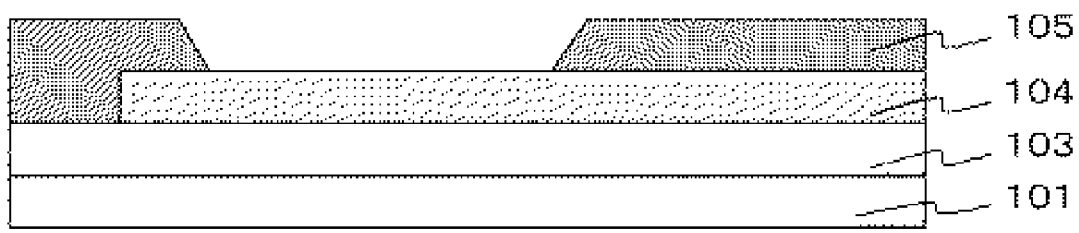

Next, a resist film is formed so as to coat the second interlayer film 105 with the resist film by a spin coating technique or the like. Then, a resist pattern is formed or the resist film by employing a photolithography technique, and thereafter a dry etch process is carried out by using the patterned resist as a mask to selectively remove the second interlayer film 105 (FIG. 3B).

Figure 3C:
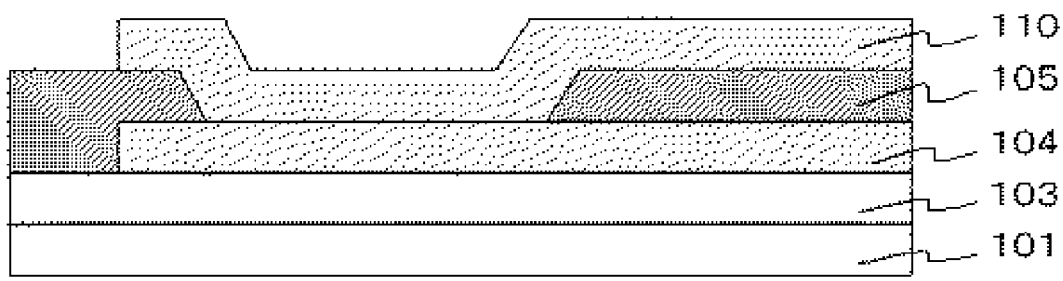

Subsequently, a second electrically conducting film 110 is deposited by a sputtering technique or the like so as to coat the first electrically conducting film 104 and the second interlayer film 105 with the second electrically conducting film 110. Al is employed as the material, composing the second electrically conducting film 110 in the present embodiment. Subsequently, a resist film is formed so as to coat the second electrically conducting film 110 with the resist film by the spin coating technique or the like. A resist pattern is formed on the resist film by employing a photolithography technique, and thereafter a dry etch process is carried out by using the patterned resist as a mask to selectively remove the second electrically conducting film 110 (FIG. 3C).

Figure 3D:
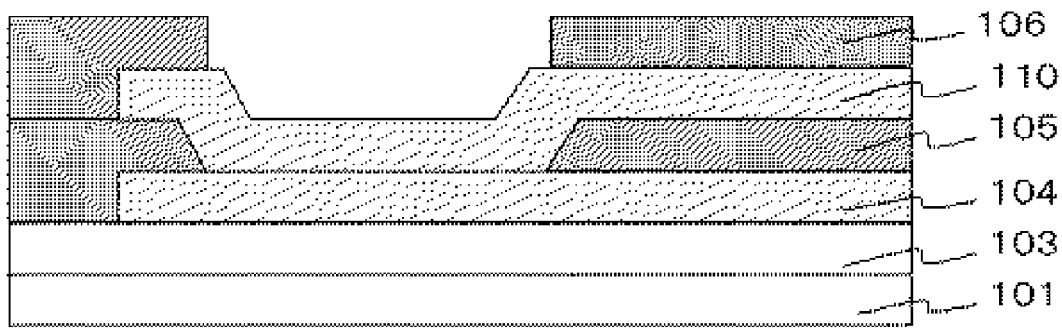

Then, a cover oxide film 106 is deposited on the second interlayer film 105 and the second electrically conducting film 110 by a CVD or the like. Available materials for composing the cover oxide film 106 include, for example, $SiO_2$, SiON, SiOC or the like. Subsequently, a resist film is formed so as to coat the cover oxide film 106 with the resist film by the spin coating technique or the like. Then, a resist pattern is formed on the resist film by employing a photolithography technique, and thereafter a dry etch process is carried out by using the patterned resist as a mask to selectively remove the cover oxide film 106 (FIG. 3D).

Figure 4A:
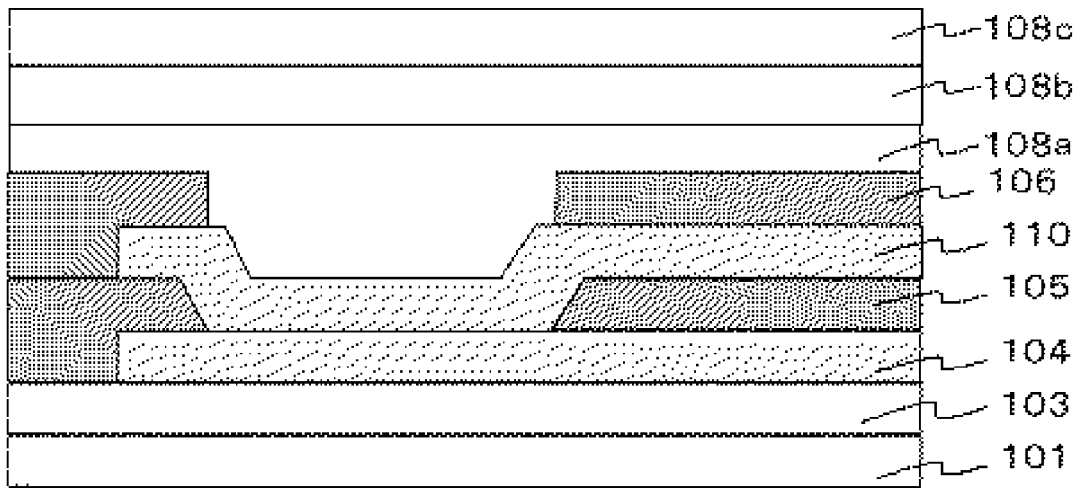
FIGS. 4A and 4B are schematic cross-sectionals views of the pad structure, for describing the process for manufacturing the pad structure according to the embodiment of the present invention.
Figure 4B:
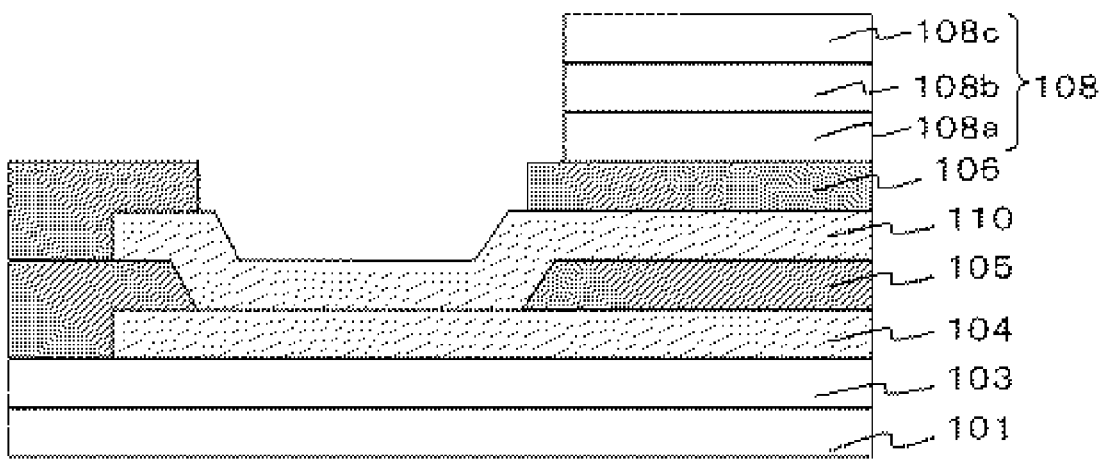

Then, the planarizing film 108a, the middle layer 108b and the topcoat 108c are sequentially deposited on the cover oxide film 106 and the second electrically conducting film 110 by the spin coating technique or the like (FIG. 4A). Subsequently, a resist film is formed so as to coat the topcoat 108c with the resist film by the spin coating technique or the like. Then, a resist pattern is formed on the resist film by employing a photolithography technique, and thereafter a dry etch process is carried out by using the patterned resist as a mask to selectively remove the planarizing film 108a, the middle layer 108b and the topcoat 108c (FIG. 4B).

Figure 5A:
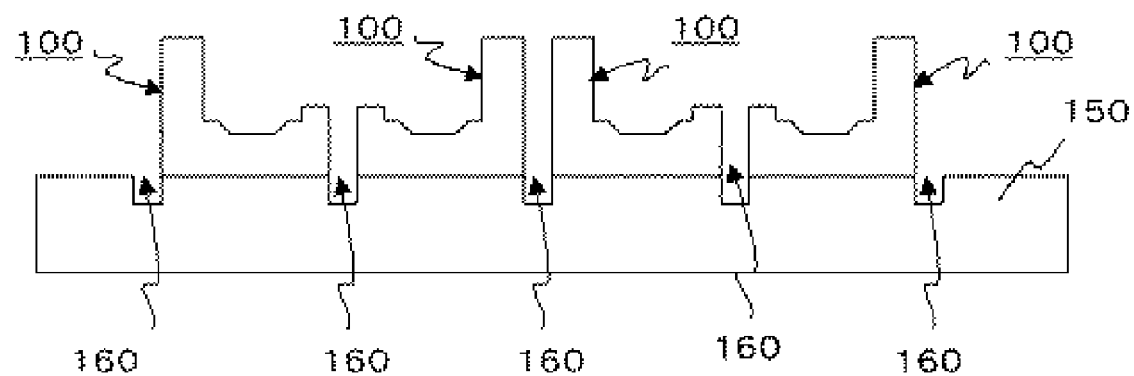
FIGS. 5A and 5B are schematic cross-sectionals views of the pad structure, for describing the process for manufacturing the pad structure according to the embodiment of the present invention.
Figure 5B:
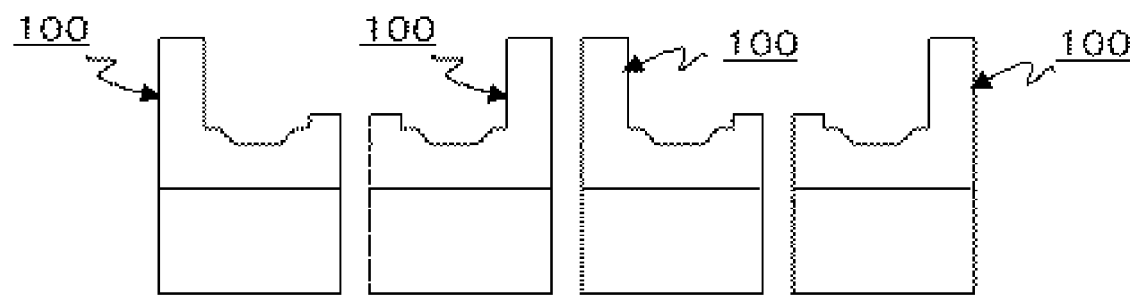

Further, a wafer 150 having a plurality of pad structure 100 formed on the wafer is diced along a scribe line 160 to provide the pad structure 100 (FIG. 5A and FIG. 5B). Here, the wafer 150 is identical to the silicon substrate 101. According to the above-described manufacturing process, the cover oxide film 106 and the transparent resin 108 are selectively removed to expose the concave portion 112 of the second electrically conducting film 110, and thereafter the dicing process is conducted to complete the manufacture of the pad structure 100.

The advantageous effect obtainable by employing the pad structure 100 will be described as follows.

The conventional techniques including the technique described in Japanese Patent Laid-Open No. 1999-17,158 involves a configuration comprising a transparent resin formed on the electric conductor that composes the electrode pad so as to surround the concave portion in the pad structure having the concave portion. Thus, when the dicing wastes or the like generated in the dicing process are adhered onto the concave portion during the manufacturing of the pad structure using the wafer process, the dicing wastes or the like tends to be remained in the concave portion even though the pad structure is cleaned using a water. On the contrary, the transparent, resin 108 provided on the cover oxide film 106 is not disposed on the side of the pad structure 100 where the second electrically conducting film 110 is coated with the cover oxide film 106 (left side in FIG. 1), and a portion of the transparent resin 108 is opened. More specifically, as shown, in FIG. 2, which is a plan view in vicinity of the concave portion 112 having a shape of rectangle, the transparent resin 108 is formed on the cover oxide film 106 that surrounds the concave portion 112 to form a "horseshoe-shaped" geometry. Thus, remaining of the dicing wastes or the like in the concave portion 112 can be inhibited by cleaning the pad structure 100 with water, even though the dicing wastes or the like generated during the dicing process are adhered onto the concave portion 112 in the process for manufacturing the pad structure 100 using the wafer process. The reasons for the inhibition is that the transparent, resin 108 has the vent opening as the transparent resin 108 is formed to have the "horseshoe-shaped", so that the dicing wastes or the like adhered onto the concave portion 112 are readily drained from the concave portion 112 during the cleaning of the pad structure 100 with water. Here, any structure can be employed for the vent opening of the transparent resin 108 as long as the employed structure promotes discharging or sweeping our of the dicing wastes or the like adhered onto the concave portion 112 to the outside of the pad structure 100. In other words, at least a portion of the transparent resin 108 may be opened to provide similar advantageous effects, even though it is not "horseshoe-shaped". More specifically, for example, only a portion of one side may be opened or alternatively two sides may be opened. Further, the cover oxide film 106 also covers over the second electrically conducting film 110 shown in the left side of FIG. 1 in the present embodiment. This can improve the insulation property of the pad structure 100. As a result, the pad structure 100 having higher reliability can be achieved while improving the insulation property and inhibiting the dicing wastes or the like remaining in the concave portion 112.

Further, since the electrode pad has the dual layer structure having the second electrically conducting film 110 being provided so as to contact with the upper face of the first electrically conducting film 104 in the concave portion 112 of the second electrically conducting film 110 in the pad structure 100, the first electrically conducting film 104 contacts with the second electrically conducting film 110, so that the mechanical impact can be easily absorbed in a case that a probe for a probe-testing comes into contact with a portion having increased thickness of the electrically conducting film in the electrode pad or in a case of conducting a bonding process on the portion having increased thickness of the electrically conducting film in the electrode pad. Therefore, a generation of a crack on the electrode pad by the mechanical impact can be further inhibited. In addition, since the portion having no contact between the first electrically conducting film 104 and the second electrically conducting film 110 is provided with the second interlayer film 105, the first electrically conducting film 104 is insulated from the second electrically conducting film 110 in the portion having no contact between the first electrically conducting film 104 and the second electrically conducting film 110. Accordingly, the pad structure 100 having further higher reliability can be achieved.

Second Embodiment

Next, a structure of a one dimensional solid-state image sensing device 200 having photo acceptance pixels that is linearly disposed on the one dimensional solid-state image sensing device 200 and also comprising the pad structure 100 shown in FIG. 1 and FIG. 2 will be described. The one dimensional (linear) solid-state image sensing device 200 is a solid-state image sensing device employed for a scanner or a photocopy machine.

Figure 7:
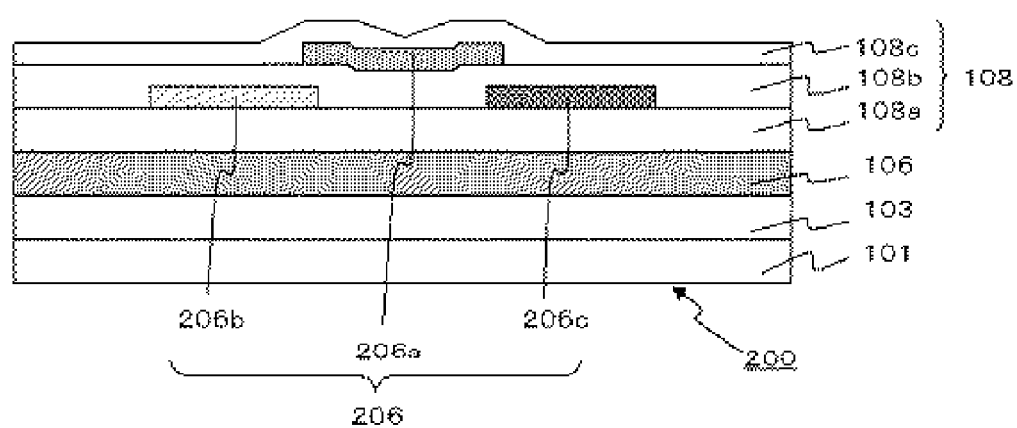
FIG. 7 is a cross-sectional view along the line a-a' of FIG. 6, schematically illustrating the structure of the solid-state image sensing device according to the embodiment of the present invention.

FIG. 6 is a plan view for describing the structure of the solid-state image sensing device 200. FIG. 7 is a cross-sectional view of FIG. 6 along a line a-a'.

The solid-state image sensing device 200 is composed of a silicon substrate 101, a first interlayer film 103, a cover oxide film 106, a filter device group 206, a bonding pad 210 employing the pad structure 100, a transparent resin 108, a photo acceptance unit (not shown in the drawings), a charge transfer unit (not shown in the drawings) and an output unit (not shown in the drawings).

The silicon substrate 101 is provided with the cover oxide film 106 formed over the silicon substrate 101, as shown in FIG. 7.

The bonding pad 210 is provided in a region on a side of a peripheral portion of the solid-state image sensing device 200, as shown in FIG. 6, and a vent opening of the pad structure 100 is provided in a region of the above-described peripheral portion so as to face toward outside in FIG. 6. Having such configuration, the dicing wastes or the like can be easily discharged to the outside of the solid-state image sensing device 200.

A color filter unit is constituted of filter devices group 206 and a transparent resin 108 over-coating of the filter devices group 206.

The filter devices group 206 functions as a color separation filter that separates light being incident through the transparent resin 108 according to colors. Here, a combination of green filter devices 206a, blue filter devices 206b and red filter devices 206c is employed for the filter devices group 206 in the present embodiment. In addition, the green filter elements 206a, the blue filter elements 206b and the red filter elements 206c are provided to form a stripe pattern on the solid-state image sensing device 200 in the present embodiment.

The photo acceptance unit comprises a photoelectric transducer in the inside of the photo acceptance unit to function as accepting light transmitted through the filter element and transferring the accepted light into an electric charge.

The charge transfer unit functions as transferring the electric charge converted by the photoelectric transducer from the photo acceptance unit to the output unit.

The output unit functions as reading the electric charge accepted through the charge transfer unit and converting the accepted charge into an image and output the converted image.

In the present embodiment, the transparent resin 108 is composed of a three-layer structure of a planarizing film 108a, a middle layer 108b and a topcoat 108c. Here, the planarizing trim 106a is provided for the purpose of flatly forming the filter devices group 206. The middle layer 108b covers the blue filter element 206b and the red filter element 206c to embed these filter elements in the middle layer 108b. The topcoat 108c is provided to protect the green filter element 206a.

The advantageous effect of the solid-state image sensing device 200 will be described as follows.

Here, the solid-state image sensing device 200 is provided with the bonding pad 210 employing the pad structure 100 having characteristics described in the first embodiment. In addition, the bonding pad 210 is provided in a region on a side of the peripheral portion of the solid-state image sensing device 200, and a recessed region (vent opening) of the pad structure 100 is provided in a region of the above-described peripheral portion so as to have the vent opening facing toward outside of the solid-state image sensing device 200 in FIG. 6. Thus, the dicing wastes or the like can be readily discharged from the concave portion 112 by a rinse process with water or the like, even though the dicing wastes or the like generated during the dicing process are adhered, onto the concave portion 112 of the bonding pad 210 in the process for manufacturing the solid-state image sensing device 200 using the wafer process, and therefore the dicing wastes or the like can easily be discharged to the outside of the solid-state image sensing device 200.

Here, similarly as in the first embodiment, any structure can be employed for the vent opening of the transparent resin 108 of the pad structure 100 as long as the employed structure promotes discharging the dicing wastes or the like adhered onto the concave portion 112 to the outside of the pad structure 100, that is, to the outside of the solid-state image sensing device 200. In other words, at least a part of the transparent resin 108 may be opened to provide similar advantageous effects, and, for example, only a part of one side may be opened or alternatively two sides may be opened.

In addition, since a circumference portion, which is a region on the side of the peripheral portion of the solid-state image sensing device 200 is coated with the cover oxide film 106, the insulation property of the solid-state image sensing device 200 can be improved. As a result, the solid-state image sensing device 200 having higher reliability can be achieved while improving the insulation property and inhibiting the dicing wastes or the like remaining in the concave portion 112 of the bonding pad 210.

Figure 8A:
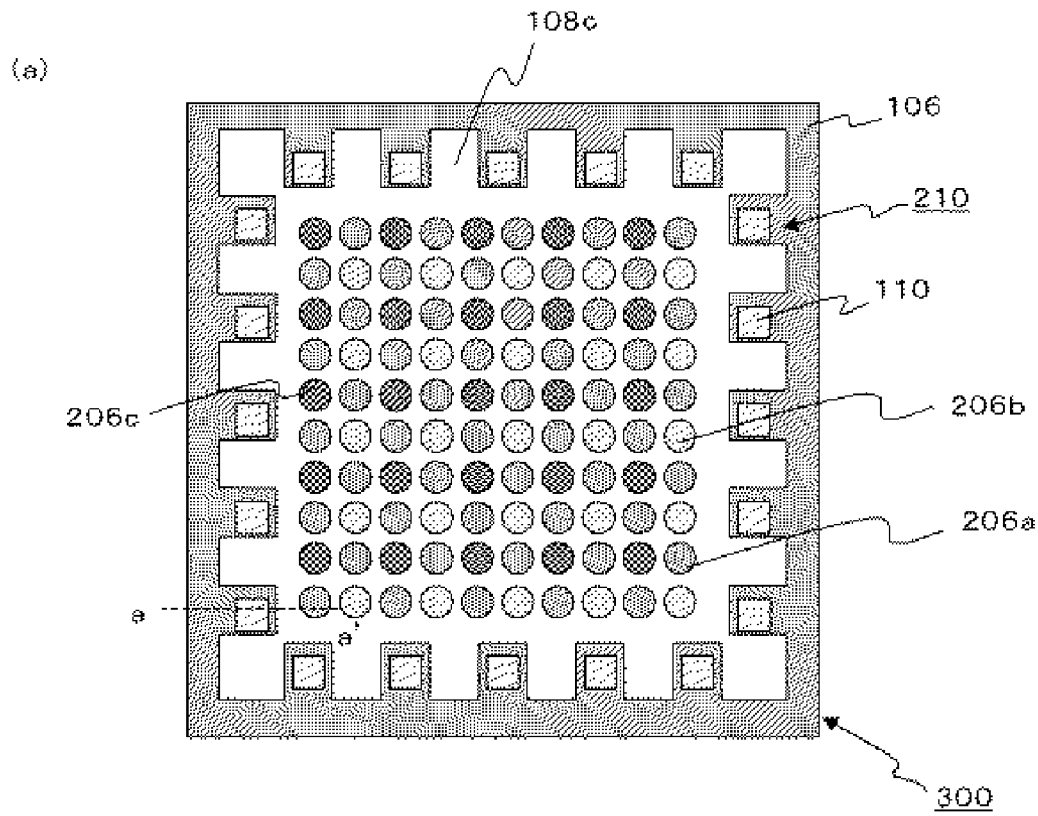
FIG. 8A is a schematic plan view of the solid-state image sensing device according to the embodiment and FIG. 8B is a cross-sectional view along the line a-a' of FIG. 8A.
Figure 8B:
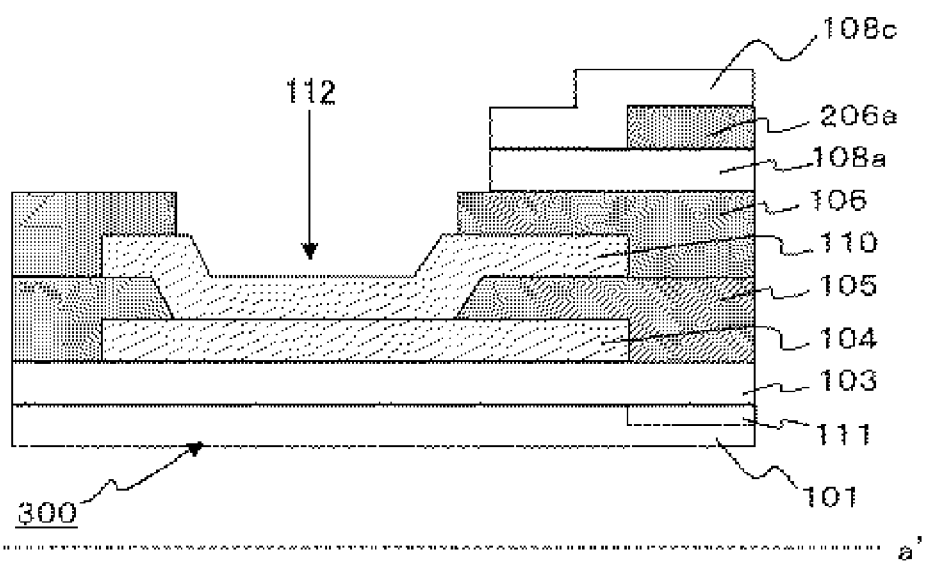

While the present embodiment has been described in reference to a configuration employing the bonding pad 210 that utilizes the pad structure 100 in one dimensional (linear) solid-state image sensing device 200, which is typically employed for a scanner or a photocopy machine, the bonding pad 210 that utilizes the pad structure 100 having the characteristics described in the first embodiment may also be employed for a two dimensional solid-state image sensing device 300 having photo acceptance pixels that are two-dimensionally arranged as shown in FIGS. 8A and 8B, which is typically employed for a digital camera.

The solid-state image sensing device 300 comprises, as shown in FIG. 8A, which is a plan view of the solid-state image sensing device 300, and FIG. 8B, which is a cross-sectional view of FIG. 8A along line a-a', a silicon substrate 101, a first interlayer film 103, a first electrically conducting film 104, a second interlayer film 105, a second electrically conducting film 110, a cover oxide film 106, a planarizing film 108a, a topcoat 108c, a filter device groups 206, a photo acceptance unit 111, a charge transfer path (not shown in the drawings) and an output unit (not shown in the drawings).

The photo acceptance unit 111 has a function of accepting the light transmitted through the filter devices group 206.

In the present embodiment, green filter devices 206a, blue filter devices 206b and red filter devices 206c, which are the color separation filters composing the filter devices group 206, are provided to form a mosaic shape on the solid-state image sensing device 300.

Here, the two-dimensional solid-state image sensing device 300 comprises the bonding pad 210 that utilizes the pad structure 100 having the characteristics described in the first embodiment. Therefore, similarly as the solid-state image sensing device 200, the dicing wastes or the like remaining in the concave portion 112 of the bonding pad 210 can be inhibited while improving the insulation property. Accordingly, the two-dimensional solid-state image sensing device 300 having higher reliability can be achieved.

While the embodiments of the present invention have been described above in reference to the annexed figures, it should be understood that the disclosures above are presented for the purpose of illustrating the present invention, and various configurations other than the above-described configurations can also be adopted.

For example, while the configuration employing the bonding pad 210 that utilizes the pad structure 100 for the solid-state image sensing device is described in the second embodiment, a bonding pad 210 utilizing the pad structure 100 in a region on a side of a peripheral portion of a device other than the solid-state image sensing device may also be employed. Examples of such device may include semiconductor devices such as LSI, IC or the like. Thus, the dicing wastes or the like can be readily discharged from the concave portion 112 by a rinse process with water or the like by using bonding pad 210 for an above-described device, even though the dicing wastes or the like generated during the dicing process are adhered onto the concave portion 112 of the bonding pad 210 in the process for manufacturing the solid-state image sensing device 200 using the wafer process, Accordingly, the dicing wastes or the like can be easily swept out or discharged to the outside of the device. Here, similarly as in the above-described embodiments, any structure can be employed for the vent, opening of the transparent resin 108 of the pad structure 100 as long as the employed structure promotes discharging the dicing wastes or the like adhered onto one concave portion 112 to the outside or the pad structure 100, that is, to the outside of the device. In other words, at least a part of the transparent resin 107 may be opened to provide similar advantageous effects, and, for example, only a portion of one side may be opened or alternatively two sides may be opened. In addition, since the circumference portion, which is the region on the side of the peripheral portion of the solid-state image sensing device 200, is coated with the cover oxide film 100, the insulation property of the device can be improved. As a result, the device having higher reliability can be achieved while improving the insulation property by inhibiting the dicing wastes or the like remaining in the concave portion 112 of the bonding pad 210.

Figure 9:
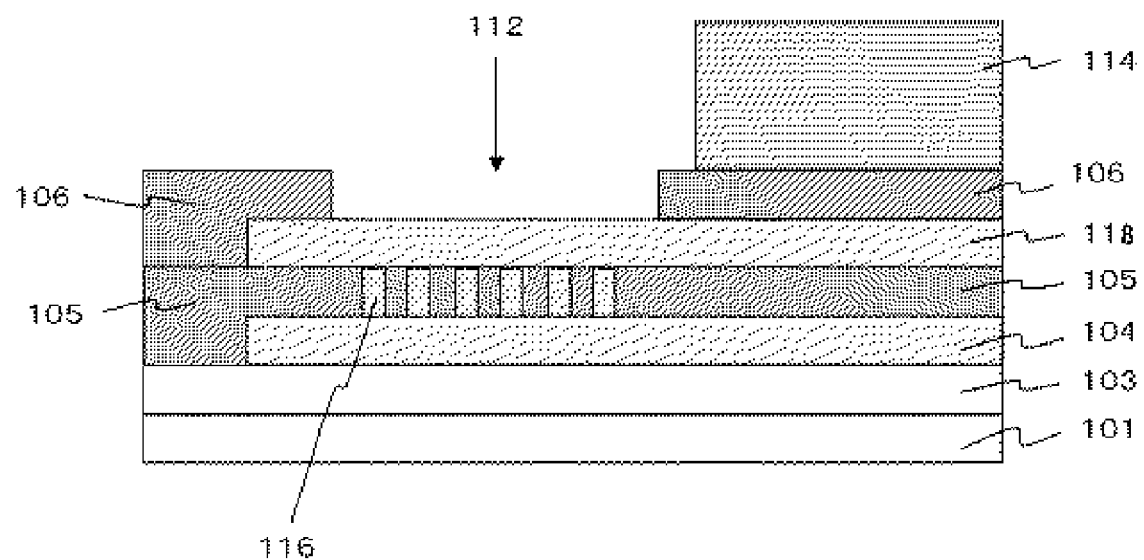
FIG. 9 is a schematic cross-sectional view of a pad structure according to an embodiment of the present invention.

Further, in the pad structure utilized in the bonding pad 210 employed in a region on a side of a peripheral portion of a device other than the solid-state image sensing device such as LSI, IC and the like, a stress relaxation layer 114 composed of an organic resin having heat resisting property such as polyimide and the like formed by using a spin coating technique or the like may also be provided on the cover oxide film 106, as shown in FIG. 9. Moreover, a configuration of electrically coupling the first electrically conducting film 104 to the second electrically conducting film 118 that is composed of Al or the like by using via plugs 116 composed of tungsten or the like may also be employed. The pad structure shown in FIG. 9 has almost same characteristics as pad structure 100 described in the above-described embodiments has, except that the stress relaxation layer 114 is provided instead of the transparent resin 108, that the first electrically conducting film 104 is electrically coupled to the second electrically conduction film 118 by the via plugs 116 and that the second electrically conducting film 118 is flat. An exertion of a thermal stress onto the device due to differential thermal expansion coefficients between the packaging resin and the device during a process for packaging the devices such as LSI, IC and the like using the packaging resin can be further avoided by being provided with the stress relaxation layer 114. Therefore, the reliability of the devices such as LSI or IC or the like can be further improved. Here, the via plugs 116 are formed by, at first, forming via holes in the second interlayer film 105 by using a dry etch process, and filling the via holes with tungsten by chemical vapor deposition (CVD) or the like, and the diameters of the via plugs 116 are on the order of 0.2 μm to 0.6 μm.

Further, while the type of the pad structure 100 having the concave portion 112 by providing the concave portion to the second electrically conducting film 110 that composes the electrode pad has been described in the above-described embodiments, the pad structure may also have a concave portion by having a step between the electrode pad and the cover oxide film. An exemplary illustration thereof may be that, as the pad structure shown in FIG. 9, for example, the second electrically conducting film 118 composing the electrode pad is flat, and a step is generated between the flat second electrically conducting film 118 and the cover oxide film 106, which is the insulating film provided so as to surround the second electrically conducting film 118 over one peripheral region, thereby providing the concave portion 112 to the pad structure.

Further, a protective sheet any be put on the transparent resin 108 during the process for manufacturing the pad structure or the solid-state image sensing device by using a wafer process. Having such configuration, an adhesion of the dicing wastes on the like onto the transparent resin during the dicing process can be inhibited. Accordingly, the pad structure, the device and the solid-state image sensing device having further improved reliability can be achieved.

In addition, it is also advantageous that the need for forming the middle layer 108b in the formation process of the transparent resin 108 can be avoided.

While the configurations that employ the silicon substrate 101 have been described in the above-described embodiments, other types of semiconductor substrates such as a chemical compound semiconductor substrate and the like may also be employed.

While the configuration employing Al for the first electrically conducting film 104 and the second electrically conducting film 110 has been described in the above-described embodiment, other combinations employing conductive material such as a combination of using Ti for the first electrically conducting film and Al for the second electrically conducting film may also be employed.

While the pad structure 100 comprising the first electrically conducting film 104 and the second, electrically conducting film 110 has been described in the above-described embodiment, a single-layered electrically conducting film for composing the pad structure may be employed, or otherwise, triple-layered or more-layered electrically conducting film may be employed. When triple-layered or more-layered electrically conducting film is employed, more impact-absorbability of the electrode pad in case of probe testing can be achieved. Accordingly, the pad structure 100 having more reliability can be achieved.

While the configuration employing the filter devices group 206 comprising the green filter devices 206a, the blue filter devices 206b and the red filter devices 206c has been described in the second embodiment, other combinations of filter elements of other colors may also be employed.

It is apparent that the present invention is not limited to the above embodiment, that may be modified and changed without departing from the scope and spirit of the invention.

What is claimed is:

1. A semiconductor device, comprising:
    a peripheral portion and an interior portion inside said peripheral portion;
    an interlayer film (105);
    an electrode pad having an exposed metal wire-contact layer (110) on the interlayer film;
    a first insulating film (106) covering the interior portion of the device and surrounding edge portions of the metal wire-contact layer at positions along said peripheral portion of the device, the first insulating film having a plurality of first openings, each exposing a respective first part of the metal wire-contact layer surrounded by the first insulating film; and
    a second insulating film (108c) covering the first insulating film in the interior portion, the second insulating film having a plurality of second openings, each exposing a respective one of the plurality of first openings and the exposed first part of the metal wire-contact layer, wherein each of the plurality of second openings open toward the peripheral portion of the device and are coupled to each other at the peripheral portion.

2. The semiconductor device of claim 1, wherein said first and second openings are rectangular.

3. The semiconductor device of claim 1, wherein said second insulating film is a resin film.

4. The semiconductor device of claim 1, wherein said first insulating film is a cover oxide and said second insulating film is a transparent resin film.

5. The semiconductor device of claim 1, wherein the first part of said metal wire-contact layer exposed by said first openings is a concavity, and said metal wire-contact layer further includes a second part that contacts the first part beneath the concavity, said interlayer film being between said first and second parts outside the concavity.

6. The semiconductor device of claim 1, further comprising a plurality of electrode pads that each includes an exposed part of said metal wire-contact layer adjacent to said peripheral portion of the device.

7. The semiconductor device of claim 1, wherein the device is a solid-state image sensing device.

8. The semiconductor device of claim 1, wherein each of the plurality of second openings are concave to receive corresponding ones of the plurality of first openings.

9. The semiconductor device of claim 8, wherein each of the pluralities of first and second openings alternate along the peripheral portion of the device.

10. The semiconductor device of claim 9, wherein width portions of the second insulating film provided between the plurality of first openings are different.

11. The semiconductor device of claim 1, wherein said second insulating film extends only partially around said plurality of first openings.

* * * * *